(12) United States Patent
Lee et al.

(10) Patent No.: US 12,349,280 B2
(45) Date of Patent: Jul. 1, 2025

(54) PRINTED CIRCUIT BOARD MODULE AND ELECTRONIC DEVICE COMPRISING SAME

(71) Applicant: LG INNOTEK CO., LTD., Seoul (KR)

(72) Inventors: Seung Min Lee, Seoul (KR); Kwang Soon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 207 days.

(21) Appl. No.: 18/020,985

(22) PCT Filed: Aug. 24, 2021

(86) PCT No.: PCT/KR2021/011279
§ 371 (c)(1),
(2) Date: Feb. 13, 2023

(87) PCT Pub. No.: WO2022/045729
PCT Pub. Date: Mar. 3, 2022

(65) Prior Publication Data
US 2023/0292440 A1  Sep. 14, 2023

(30) Foreign Application Priority Data
Aug. 24, 2020  (KR) .................. 10-2020-0106472

(51) Int. Cl.
*H05K 1/18* (2006.01)
*H05K 1/02* (2006.01)
(Continued)

(52) U.S. Cl.
CPC ........... *H05K 1/181* (2013.01); *H05K 1/0203* (2013.01); *H05K 1/05* (2013.01); *H05K 3/3421* (2013.01); *H05K 3/3447* (2013.01)

(58) Field of Classification Search
CPC ........ H05K 1/181; H05K 1/0203; H05K 1/05; H05K 3/3421; H05K 3/3447
(Continued)

(56) References Cited

U.S. PATENT DOCUMENTS 10,849,237 B2 * 11/2020 Cho ........................ B21J 9/08
2004/0120125 A1   6/2004 Taylor et al.
(Continued)

FOREIGN PATENT DOCUMENTS

JP    2006-060889       3/2006
JP    2006060889 A  *  3/2006
(Continued)

OTHER PUBLICATIONS

International Search Report dated Nov. 30, 2021 issued in Application No. PCT/KR2021/011279.
(Continued)

*Primary Examiner* — Andargie M Aychillhum
(74) *Attorney, Agent, or Firm* — KED & ASSOCIATES, LLP

(57) ABSTRACT

A printed circuit board module comprises: a first substrate; a second substrate disposed on the first substrate and including a first region and a second region; a first element disposed on the front surface of the first region; and a second element disposed on the front surface of the second region, wherein the lower end of the first region and the lower end of the second region are disposed in a stepped manner.

20 Claims, 3 Drawing Sheets

(51) Int. Cl.
*H05K 1/05* (2006.01)
*H05K 3/34* (2006.01)

(58) Field of Classification Search
USPC .......................................................... 361/760
See application file for complete search history.

(56) References Cited

U.S. PATENT DOCUMENTS

| | | |
|---|---|---|
| 2011/0211310 A1 | 9/2011 | Farling et al. |
| 2013/0078825 A1* | 3/2013 | Wain ...................... H05K 3/366 |
| | | 29/830 |
| 2015/0146384 A1 | 5/2015 | Choi |
| 2017/0261701 A1* | 9/2017 | Izawa .................. G02B 6/4292 |
| 2018/0220528 A1* | 8/2018 | Ikeda .................. H01L 25/0655 |
| 2018/0254571 A1 | 9/2018 | Herring et al. |
| 2020/0194879 A1* | 6/2020 | Lim ....................... H01Q 1/243 |

FOREIGN PATENT DOCUMENTS

| | | |
|---|---|---|
| KR | 10-2005-0113734 | 12/2005 |
| KR | 10-2009-0111505 | 10/2009 |
| KR | 10-2020-0072251 | 6/2020 |

OTHER PUBLICATIONS

Korean Office Action dated Nov. 1, 2024 issued in Application No. 10-2020-0106472.

* cited by examiner

PRINTED CIRCUIT BOARD MODULE AND ELECTRONIC DEVICE COMPRISING SAME

CROSS-REFERENCE TO RELATED PATENT APPLICATIONS

This application is a U.S. National Stage Application under 35 U.S.C. § 371 of PCT Application No. PCT/KR2021/011279, filed Aug. 24, 2021, which claims priority to Korean Patent Application No. 10-2020-0106472, filed Aug. 24, 2020, whose entire disclosures are hereby incorporated by reference.

TECHNICAL FIELD

The present embodiment relates to a printed circuit board module and an electronic device comprising same.

BACKGROUND ART

A power supply device is a device that supplies electricity to electronic devices such as computers. Computers other than personal use cannot use the general power supply of homes or buildings, so 208V, 60 Hz which is an industrial power supply is used. However, this also requires a high-accuracy constant-frequency, constant-voltage device because the tolerance for frequency and voltage fluctuations is large. Since 60 Hz is the default for both American and Korean models, it must be converted to 60 Hz with a frequency converter in places where 50 Hz is being used.

An external shape of the electronic device is formed by the housing, and a plurality of electronic components for driving are disposed in the housing. The plurality of electronic components includes printed circuit boards. A plurality of components for driving the power supply device is disposed on one surface or both surfaces of the printed circuit board.

Since the plurality of components generates heat by driving and each component requires insulation from each other, there is a structural difficulty in arranging the plurality of components on the printed circuit board.

DETAILED DESCRIPTION OF THE INVENTION

Technical Subject

An objective of the present embodiment is to provide a printed circuit board module capable of efficiently arranging a plurality of components on a printed circuit board by improving the structure and an electronic device including the same.

Technical Solution

A printed circuit board module according to the present embodiment comprises: a first substrate; a second substrate being disposed on the first substrate and including a first region and a second region; a first element being disposed on a front surface of the first region; and a second element being disposed on a front surface of the second region, wherein a lower end of the first region and a lower end of the second region are disposed in a stepped manner.

The first substrate and the second substrate is disposed perpendicular to each other, a lower end of the first region is spaced apart from an upper surface of the first substrate, and a lower end of the second region may be in contact with an upper surface of the first substrate.

The first element includes a body including a first hole; and a lead being extended downward from the body and coupled to the first substrate, wherein the first element may be coupled to the second substrate through a pin penetrating the first hole.

The second element may be soldered to a front surface of the second substrate.

A coupling part being protruded downward is disposed at a lower end of the second region, a coupling hole into which the coupling part is coupled is disposed in the first substrate, and a terminal portion may be disposed on a side surface of the coupling part.

The terminal portion may be connected to the second element through a circuit pattern being disposed on the second substrate.

The coupling part may be provided in plural and disposed to be spaced apart from each other.

The second substrate may be a metal printed circuit board (PCB) on which a circuit pattern is formed on one surface of a metal plate.

A heat dissipation plate may be disposed on a rear surface of the second substrate.

An electronic device according to the present embodiment includes: a housing; and a printed circuit board module being disposed inside the housing, wherein the printed circuit board module includes: a first board; a second substrate being disposed on the first substrate and including a first region and a second region; a first element being disposed on a front surface of the first region; and a second element being disposed on a front surface of the second region, wherein a lower end of the first region and a lower end of the second region are disposed in a stepped manner.

Advantageous Effects

According to the present invention, since a plurality of elements having different coupling methods can be disposed on a single substrate, design freedom can be increased.

In addition, there is an advantage in that heat dissipation efficiency can be improved by utilizing a metal PCB.

In addition, since a region becomes unnecessary for arranging the protruded part for coupling with the first substrate as much as the region for arranging the first element, there are advantages in that a sufficient insulation distance can be secured and a wider space inside the housing can be secured.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
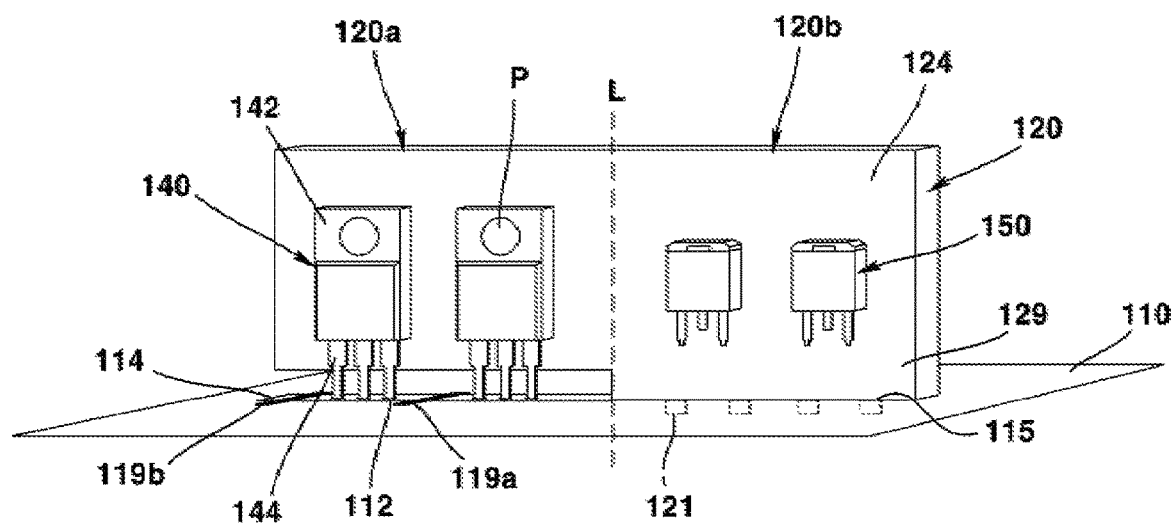
FIG. 1 is a perspective view of a printed circuit board module according to an embodiment of the present invention.
Figure 2:
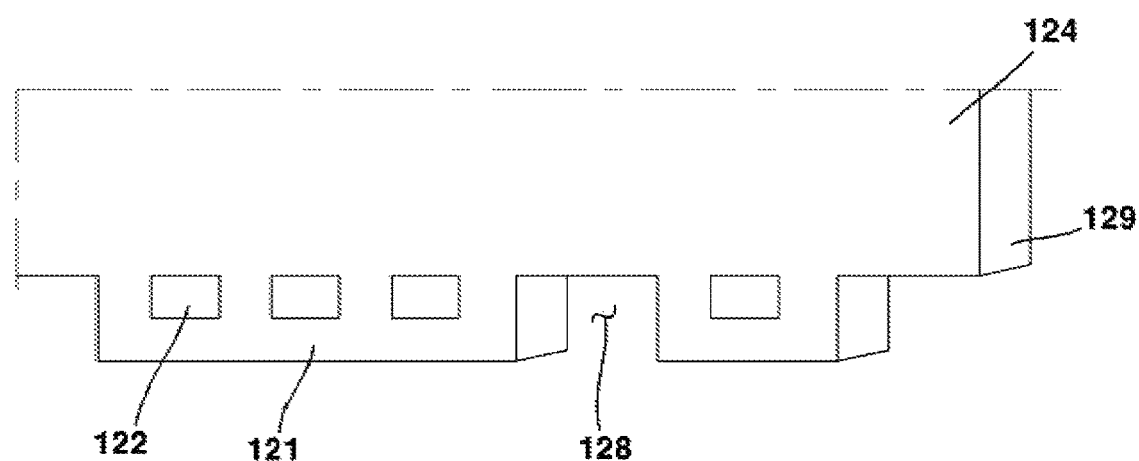
FIG. 2 is a perspective view illustrating a portion of a lower region of a second substrate according to an embodiment of the present invention.

FIG. 1 is a perspective view of a printed circuit board module according to an embodiment of the present invention; FIG. 2 is a perspective view illustrating a portion of a lower region of a second substrate according to an embodiment of the present invention; and FIG. 3 is a top plan view of a second substrate according to an embodiment of the present invention.

Figure 3:
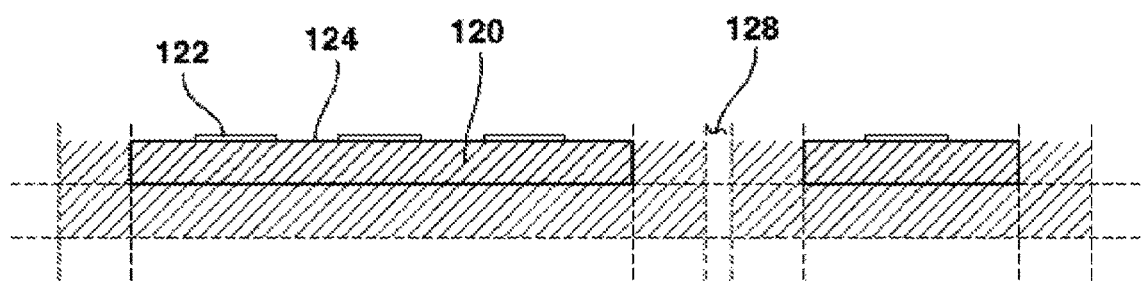
FIG. 3 is a top plan view of a second substrate according to an embodiment of the present invention.

Referring to FIGS. 1 to 3, a printed circuit board module according to an embodiment of the present invention may comprise: a first board 110; a second board 120; a first element 140; and a second element 150. The printed circuit board module may be disposed inside a housing forming an external shape of the power supply device.

The first substrate 110 is formed in a plate shape and may form a base of the printed circuit board module. The first substrate 110 may support a lower end of the second substrate 120. The first substrate 110 may be a printed circuit board (PCB) on which at least one element is mounted. The element may be mounted on an upper surface or a lower surface of the first substrate 110. The first substrate 110 may be disposed on the bottom surface of the housing.

The second substrate 120 may be disposed at an upper portion of the first substrate 110. A lower end of the second substrate 120 may be coupled to an upper surface of the first substrate 110. The second substrate 120 may be disposed perpendicular to the first substrate 110. A protruded part 129 being protruded more downward than other regions may be formed on a lower surface of the second substrate 120. The second substrate 120 may be partitioned into a first region 120a and a second region 120b with respect to the center L. The protruded part 129 may be formed at a lower end of the second region 120b. Accordingly, a lower end of the first region 120a and a lower end of the second region 120b may be disposed in a stepped manner.

The second substrate 120 may be a metal PCB made of a metal material. The metal PCB is a metal sheet having an electrode (circuit) pattern formed on one surface of a metal plate for insulation, and has an advantage of excellent heat dissipation efficiency. A mounting surface 124 may be disposed on one surface of the second substrate 120 to mount the first element 140 and the second element 150 thereon. The mounting surface 124 may be treated for insulation.

The second substrate 120 may be understood as a structure in which the mounting surface 124 is disposed on one surface of an insulating layer. Electrodes being electrically connected to the first element 140 and the second element 150 may be disposed on the mounting surface 124. In a region other than the mounting surface 124 among an outer surface of the second substrate 120, an insulating layer may be exposed to the outside. The insulating layer has electrical insulating properties, but may be formed of a material having good thermal conductivity for smooth discharging of the heat generated from the first element 140 and the second element 150. For an example, the material of the insulating layer may include aluminum.

When assuming that the mounting surface 124 is disposed on a front surface of the second substrate 120, a metal region (insulating layer) forming the body of the metal PCB may be exposed to the outside through a side surface and a rear surface of the second substrate 120.

The mounting surface 124 may be partitioned into the first region 120a and the second region 120b with respect to the center L.

A first element 140 and a second element 150 may be disposed on the mounting surface 124. A first element 140 may be disposed in the first region 120a, and a second element 150 may be disposed in the second region 120b. Each of the first element 140 and the second element 150 may be provided in plural and disposed to be spaced apart from each other.

The first element 140 may be disposed on a front surface of the first region 120a. The first element 140 may include a body 142 and a lead 144 being extended downward from a lower end of the body 142 and coupled to the first substrate 110. The lead 144 may be soldered on the first substrate 110.

The body 142 may include a first hole penetrating from one surface to the other surface. In addition, the first element 140 may be coupled to the second substrate 120 through a pin P penetrating the first hole. A second hole facing the first hole is also disposed in the second substrate 120, to which the pin P may be coupled. The pin P, the first hole, and the second hole may have a screw-coupling structure through a screw thread and a screw groove. A rear surface of the body 142 may be in contact with the mounting surface 124. Unlike this, a heat dissipation pad (not shown) is interposed between a rear surface of the body 142 and the mounting surface 124, so that the heat generated by driving the first element 140 can be more easily transferred to the second substrate 120.

The lead 144 may be coupled to the first substrate 110. A first coupling hole 112 to which the lead 144 is coupled may be formed in the first substrate 110. A circuit pattern 114 to be electrically connected to the lead 144 may be formed on an inner circumferential surface of the first coupling hole 112 or on the first substrate 110 adjacent to the first coupling hole 112. The leads 144 may be provided in plural and spaced apart from each other. Based on the single first element 140, the number of leads 144 may be two or three.

Meanwhile, a lower end of the first region 120a on which the first element 140 is disposed may be spaced apart from an upper surface of the first substrate 110 by a predetermined distance.

The second element 150 may be disposed on a front surface of the second region 120b. The second element 150 may be surface mounted (SMT) on a front surface of the second region 120b. The second element 150 may be soldered to a front surface of the second region 120b. A circuit pattern for electrical connection with the second element 150 may be formed on a rear surface of the second element 150 being in contact with the mounting surface 124. The plurality of second elements 150 may be disposed to face the plurality of first elements 140 with respect to the center L.

As described above, the protruded part 129 being protruded downward may be disposed at a lower end of the second region 120b. Also, a coupling part 121 being protruded downward and coupled to the first substrate 110 may be formed at a lower end of the protruded part 129. The coupling part 121 is for physically and electrically connecting the second substrate 120 and the first substrate 110, and the second element 150 and the first substrate 110, wherein a second coupling hole 115 may be formed on the first substrate 110 to couple the coupling part 121 thereto.

The coupling parts 121 may be provided in plural and disposed to be spaced apart from each other, and the cross-sectional shapes or sizes of the plurality of coupling parts 121 may be formed to be different from each other. The number of coupling parts 121 may correspond to the number of second elements 150. A separation part 128 may be disposed between the plurality of coupling parts 121. An insulation distance between the plurality of coupling parts 121 may be sufficiently secured through the separation part 128.

A terminal portion 122 may be formed on a side surface of the coupling part 121 corresponding to the mounting surface 124. The terminal portion 122 is for electrically connecting the second element 150 and the first substrate 110, and is disposed on the mounting surface 124; and a circuit pattern being connected to the second element 150 may be connected to the terminal portion 122. A circuit pattern being in contact with the terminal portion 122 may be formed on an inner circumferential surface of the second coupling hole 115 facing the terminal portion 122 or a region of the first substrate 110. Accordingly, the second element 150 and the first substrate 110 may be electrically connected.

Meanwhile, in the present embodiment, for example, it is taken that the first element 140 is coupled to the second substrate 120 through the pin P, and the second element 150 is surface mounted on the second substrate 120, but unlike this, both the first element 140 and the second element 150 may be surface mounted on one surface of the second substrate 120. In this case, the circuit pattern being connected to the first element 140 is extended to a terminal portion being disposed on one surface of some among the plurality of coupling parts 121, so that the first element 140 may be electrically connected to the first substrate 110.

According to the structure as described above, since a plurality of elements having different coupling methods can be disposed on a single substrate, design freedom can be increased.

In addition, there is an advantage in that heat dissipation efficiency can be improved by utilizing a metal PCB.

In addition, since a region becomes unnecessary for arranging the protruded part for coupling with the first substrate as much as the region for arranging the first element, there are advantages in that a sufficient insulation distance can be secured and a wider space inside the housing can be secured.

Meanwhile, a plurality of elements may be disposed on the first substrate 110. The plurality of elements may be mounted on the first substrate 110. The plurality of elements may be disposed to be spaced apart from each other.

On the first substrate 110, signal lines 119a and 119b electrically connecting the plurality of elements to each other may be formed. The signal lines 119a and 119b may be circuit patterns. For example, the signal lines 119a and 119b may electrically connect a third element and a fourth element being disposed on the first substrate 110 to each other. As another example, the signal lines 119a and 119b may electrically connect a third element being disposed on the first substrate 110 and an external terminal to each other.

According to the printed circuit board module according to the present embodiment, since a lower end of the second substrate 120 is spaced apart from the first substrate 110 other than a region where the coupling part 121 is formed, a region in which the signal lines 119a and 119b are being disposed on the first substrate 110 may be secured more widely.

Specifically, as shown in FIG. 1, at least a portion of the signal lines 119a and 119b may be disposed in a region being overlapped with the first region 120a in an up and down direction. Specifically, the signal lines 119a and 119b may be disposed on the first substrate 110 facing a lower end of the first region 120a. Accordingly, the above-described third element and the fourth element or external terminal may be arranged to face each other or to be partitioned with respect to the first region 120a.

Therefore, a wide space can be secured on the first substrate 110 as much as the region where the coupling part 121 is not disposed among the lower regions of the second substrate 120, so that other components including the aforementioned signal lines 119a and 119b may be disposed.

Figure 4:
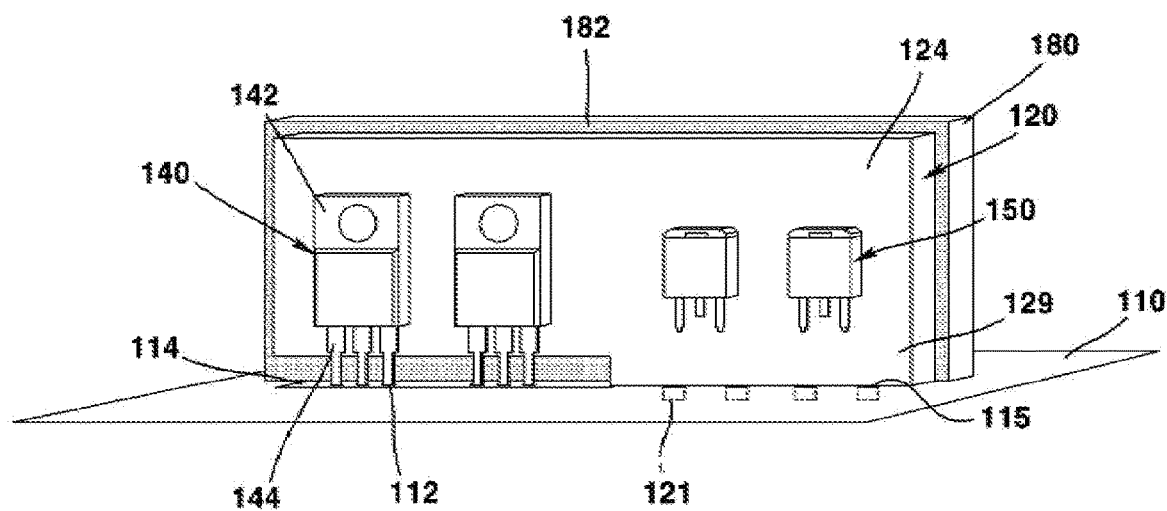
FIG. 4 is a perspective view of a printed circuit board module according to a second embodiment of the present invention.

FIG. 4 is a perspective view of a printed circuit board module according to a second embodiment of the present invention.

In the present embodiment, other portions are the same as the previous embodiment, but there is a difference in the heat dissipation member. Hereinafter, only the characteristic portions of the present embodiment will be described, and the rest of the embodiments will be cited.

Referring to FIG. 4, the printed circuit board module may include a heat dissipation member 180. The heat dissipation member 180 may be disposed on the other surface of the second substrate 120. The other surface may be a surface facing the surface on which the first element 140 and the second element 150 are being disposed among the outer surfaces of the second substrate 120. One surface of the heat dissipation member 180 may be in contact with other surface of the second substrate 120.

The heat dissipation member 180 may have a plate shape made of metal. The heat dissipation member 180 may be referred to as a heat dissipation plate. The cross-sectional area of the heat dissipation member 180 may be formed to be larger than the cross-sectional area of the second substrate 120.

Meanwhile, a heat dissipation pad 182 may be disposed between the heat dissipation member 180 and the second substrate 120. One surface and the other surface of the heat dissipation pad 182 may be in contact with a front surface of the heat dissipation member 180 and a rear surface of the second substrate 120, respectively. The heat dissipation pad 182 is formed of a material having excellent thermal conductivity, and may transfer heat from the second substrate 120 to the heat dissipation member 180.

According to the structure as described above, there are advantages in that the heat being generated from the second substrate 120 is transferred to the heat dissipation member 180 so that heat dissipation efficiency can be further improved.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A printed circuit board module comprising:
a first substrate;
a second substrate being disposed on the first substrate and including a first region and a second region;
a first element being disposed on a front surface of the first region; and
a second element being disposed on a front surface of the second region,
wherein a lower end of the first region and a lower end of the second region are disposed in a stepped manner,
wherein the first substrate includes a first coupling hole to which the first element is coupled and a second coupling hole to which the second substrate is coupled,
wherein the lower end of the first region is spaced apart from an upper surface of the first substrate,
wherein the lower end of the second region is in contact with the upper surface of the first substrate,
wherein a coupling part protruded downward is disposed at the lower end of the second region,
wherein the coupling part is coupled to the second coupling hole,
wherein the first element includes a lead that protrudes downward from the lower end of the first region and is coupled to the first coupling hole,
wherein the first element is electrically connected to the first substrate through the lead, and
wherein the second element is electrically connected to the first substrate through a connection between the coupling part and the second coupling hole.

2. The printed circuit board module according to claim 1, wherein the first substrate and the second substrate is disposed perpendicular to each other.

3. The printed circuit board module according to claim 1, wherein the first element includes a body including a first hole, and
wherein the first element is coupled to the second substrate through a pin penetrating the first hole.

4. The printed circuit board module according to claim 1, wherein the second element is soldered to a front surface of the second substrate.

5. The printed circuit board module according to claim 1, wherein a terminal portion is disposed on a side surface of the coupling part.

6. The printed circuit board module according to claim 5, wherein the terminal portion is connected to the second element through a circuit pattern being disposed on the second substrate.

7. The printed circuit board module according to claim 1, wherein the coupling part is provided in plural and disposed to be spaced apart from each other.

8. The printed circuit board module according to claim 1, wherein the second substrate is a metal printed circuit board (PCB) on which a circuit pattern is formed on one surface of a metal plate.

9. The printed circuit board module according to claim 1, wherein a heat dissipation plate is disposed on a rear surface of the second substrate.

10. The printed circuit board module according to claim 1, wherein a signal line electrically connecting different elements is disposed on the upper surface of the first substrate, and
wherein at least a portion of the signal line is disposed to overlap the first region.

11. An electronic device including:
a housing; and
a printed circuit board module being disposed inside the housing,
wherein the printed circuit board module includes:
a first substrate;
a second substrate being disposed on the first substrate and including a first region and a second region;
a first element being disposed on a front surface of the first region; and
a second element being disposed on a front surface of the second region, and
wherein a lower end of the first region and a lower end of the second region are disposed in a stepped manner, and
wherein the first substrate includes a first coupling hole to which the first element is coupled and a second coupling hole to which the second substrate is coupled,
wherein the lower end of the first region is spaced apart from an upper surface of the first substrate, wherein the lower end of the second region is in contact with the upper surface of the first substrate,
wherein a coupling part protruded downward is disposed at the lower end of the second region,
wherein the coupling part is coupled to the second coupling hole,
wherein the first element includes a lead that protrudes downward from the lower end of the first region and is coupled to the first coupling hole,
wherein the first element is electrically connected to the first substrate through the lead, and
wherein the second element is electrically connected to the first substrate through a connection between the coupling part and the second coupling hole.

12. The electronic device according to claim 11, wherein the first substrate and the second substrate is disposed perpendicular to each other.

13. The electronic device according to claim 11, wherein the first element includes a body including a first hole, and
wherein the first element is coupled to the second substrate through a pin penetrating the first hole.

14. The electronic device according to claim 11, wherein the second element is soldered to a front surface of the second substrate.

15. The electronic device according to claim 11, wherein a terminal portion is disposed on a side surface of the coupling part.

16. The electronic device according to claim 15, wherein the terminal portion is connected to the second element through a circuit pattern being disposed on the second substrate.

17. The electronic device according to claim 11, wherein the coupling part is provided in plural and disposed to be spaced apart from each other.

18. The electronic device according to claim 11, wherein the second substrate is a metal printed circuit board (PCB) on which a circuit pattern is formed on one surface of a metal plate.

19. The electronic device according to claim 11, wherein a heat dissipation plate is disposed on a rear surface of the second substrate.

20. The electronic device according to claim 11, wherein a signal line electrically connecting different elements is disposed on the upper surface of the first substrate, and
wherein at least a portion of the signal line is disposed to overlap the first region.

* * * * *